(12) United States Patent
Sharma et al.

(10) Patent No.: US 9,229,051 B2
(45) Date of Patent: *Jan. 5, 2016

(54) INTEGRATED CIRCUIT WITH DEGRADATION MONITORING

(71) Applicant: FREESCALE SEMICONDUCTOR, INC., Austin, TX (US)

(72) Inventors: Puneet Sharma, Austin, TX (US);
Matthew A. Thompson, Round Rock, TX (US); Willard E. Conley, Austin, TX (US)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/677,800

(22) Filed: Nov. 15, 2012

(65) Prior Publication Data

US 2014/0132315 A1    May 15, 2014

(51) Int. Cl.
*G01R 31/30* (2006.01)
*G01R 31/28* (2006.01)

(52) U.S. Cl.
CPC ........ *G01R 31/3016* (2013.01); *G01R 31/2884* (2013.01)

(58) Field of Classification Search
CPC .............................................. G01R 31/318552
USPC .......................................... 714/731, 716, 700
See application file for complete search history.

(56) References Cited

U.S. PATENT DOCUMENTS

| | | | |
|---|---|---|---|
| 3,806,814 A * | 4/1974 | Forbes ......................... | 725/119 |
| 5,682,323 A | 10/1997 | Pasch et al. | |
| 6,425,117 B1 | 7/2002 | Pasch et al. | |
| 7,054,787 B2 | 5/2006 | Gauthier et al. | |
| 7,516,379 B2 * | 4/2009 | Rohrbaugh et al. .......... | 714/731 |
| 7,903,613 B2 | 3/2011 | Ozluturk et al. | |
| 7,929,498 B2 | 4/2011 | Ozluturk et al. | |
| 8,081,003 B2 * | 12/2011 | Pacha et al. .................. | 324/537 |
| 2008/0084228 A1 | 4/2008 | Liu et al. | |
| 2008/0104561 A1 | 5/2008 | Carpenter et al. | |
| 2009/0150656 A1 | 6/2009 | Abella et al. | |
| 2009/0179689 A1 | 7/2009 | Bolam et al. | |
| 2010/0214007 A1 | 8/2010 | Konstadinidis | |

(Continued)

OTHER PUBLICATIONS

Oner, Hakan et al., "A Compact Monitoring Circuit for Real-Time On-Chip Diagnosis of Hot-Carrier Induced Degradation", Proc. IEEE 1997 Int. Conference on Microelectronic Test Structures, vol. 10, Mar. 1997, pp. 72-76.

(Continued)

*Primary Examiner* — Fritz Alphonse

(57) ABSTRACT

An integrated circuit including a degradation monitoring circuit. The degradation monitoring circuit includes a comparison circuit having a delay element including an input coupled to a data node of a timing path and having an output to provide a delayed signal of a data signal of the data node. The comparison circuit includes a logic comparator that provides a logic comparison between a data signal of the data node and the output of the delay element. The monitoring circuit includes a sampling circuit that provides a sampled signal of the output of the logic comparator that is a sampled with respect to a clock signal of the clock signal line. The monitoring circuit includes a hold circuit that provides a signal indicative of a data signal of the data node transitioning within a predetermined time of an edge transition of a clock signal of the clock signal line.

20 Claims, 3 Drawing Sheets

(56) References Cited

U.S. PATENT DOCUMENTS

2011/0050247 A1 3/2011 Marshall
2011/0267096 A1 11/2011 Chlipala et al.

OTHER PUBLICATIONS

U.S. Appl. No. 13/956,126, Abadir, M, "Integrated Circuit With Degradation Monitoring", Office Action-Rejection, mailed Apr. 9, 2015.

Fuketa, H. et al., "Adaptive Performance Compensation With In-Situ Timing Error Predictive Sensors for Subthreshold Circuits", IEEE Transactions on Very Large Scale Integration (VLSI) Systems, vol. 20, Issue 2, Feb. 2012, pp. 333-343.

Ernst, D. et al., "Razor: A Low-Power Pipeline Based on Circuit-Level Timing Speculation", 36th Annual IEEE/ACM International Symposium on Microarchitecture, Dec. 3-5, 2003, pp. 7-18.

Blaauw, et al., "Razor II: In Situ Error Detection and Correction for PVT and SER Tolerance", IEEE International Solid-State Circuits Conference, Feb. 3-7, 2008, 3 pages.

Wang, X. et al., "Design and Analysis of a Delay Sensor Applicable to Process/Environmental Variations and Aging Measurements", IEEE Transactions on Very Large Scale Integration (VLSI) Systems, vol. 20, Aug. 2012, pp. 1405-1418.

Agarwal, M. et al., "Circuit Failure Prediction and Its Application to Transistor Aging", 25th IEEE VLSI Test Symposium, May 6-10, 2007, 8 pages.

Bowman, K. et al., "Energy-Efficient and Metastability-Immune Timing-Error Detection and Instruction-Replay-Based Recovery Circuits for Dynamic-Variation Tolerance", IEEE International Solid-State Circuits Conference, Feb. 3-7, 2008, 3 pages.

Tsien, D. et al., "Context-specific leakage and delay analysis of a 65nm standard cell library for lithography-induced variability", IEEE International SOC Conference, Sep. 26-29, 2007, pp. 261-268.

Yu, S. et al., "A Pattern-Based Domain Partition Approach to Parallel Optical Proximity Correction in VLSI Designs", Proceedings of the 19th IEEE International Parallel and Distributed Processing Symposium (IPDPS'05), Apr. 4-8, 2005, 7 pages.

Kahng, A. et al., "Auxiliary pattern-based optical proximity correction for better printability, timing, and leakage control", Journal of Micro/Nanolithography, MEMS, and MOEMS, Jan.-Mar. 2008, vol. 7, Issue 1, 13 pages.

U.S. Appl. No. 13/956,126, Sharma, P., "Integrated Circuit With Degradation Monitoring", Office Action—Notice of Allowance, mailed Nov. 5, 2015.

\* cited by examiner

United States Patent

INTEGRATED CIRCUIT WITH DEGRADATION MONITORING

BACKGROUND

1. Field

This disclosure relates generally to integrated circuits, and more specifically, to degradation monitoring within an integrated circuit.

2. Related Art

As an integrated circuit ages, the integration circuit experiences circuit degradation which causes delay margins of the digital circuits to decrease over time. Circuit degradation may occur due to various physical phenomena which may result in slowing down transistors and interconnects over time, such as, for example, negative bias temperature instability (NBTI), positive bias temperature instability (PBTI), hot carrier injection, and electromigration. As the integrated circuit continues to age, the delay margins can continue decreasing to the point at which delay faults occur. These delay faults result in catastrophic failure of the integrated circuit without warning.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

As integrated circuits age, circuit degradation results in decreasing delay margins. In one embodiment, a degradation monitoring circuit is used to monitor delay margin over an integrated circuit's lifetime in order to indicate a warning when the delay margin reaches a critical point, prior the circuit degradation resulting in an actual delay fault or error. Furthermore, these degradation monitoring circuit can be used in various places throughout an integrated circuit, and their outputs can be aggregated in order to provide a warning external to the integrated circuit to indicate when a delay margin has reached a critical point and a delay fault is imminent.

Figure 1:
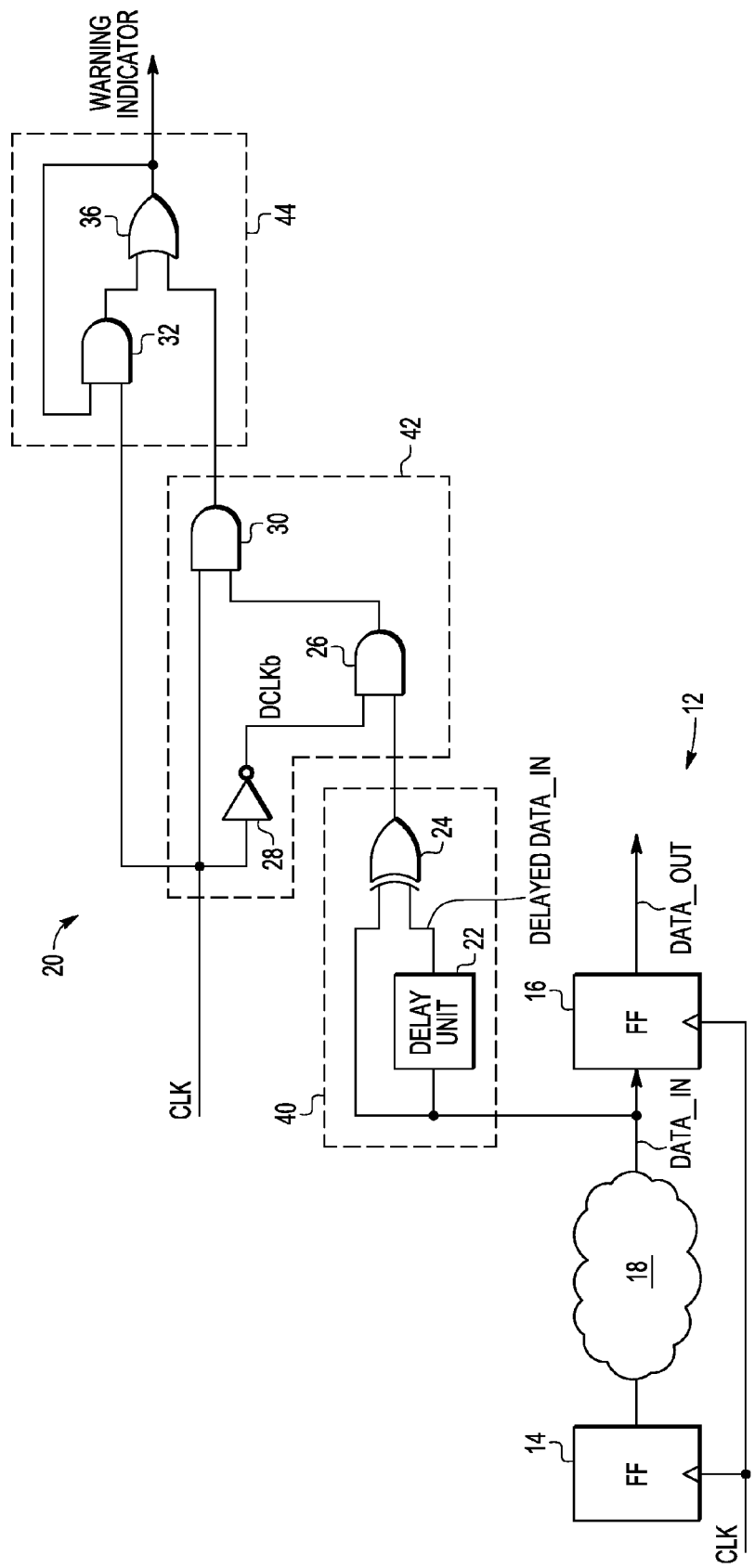
FIG. 1 illustrates, in partial schematic and partial block diagram form, an integrated circuit having a degradation monitoring circuit in accordance with one embodiment of the present disclosure.

FIG. 1 illustrates, in partial schematic and partial block diagram form, an integrated circuit (IC) 10, in accordance with an embodiment of the present disclosure. IC 10 includes a timing path 12 which includes a flip flop 14, combination logic 18, and a flip flop 16. The clock inputs of each of flip flops 14 and 16 is coupled to a clock signal line to receive a clock signal, CLK. Flip flop 16 provides its data output to combination logic 18, and combinational logic 18 provides a data input, DATA_IN, to flip flop 16. Note that DATA_IN may also be referred to as a data node. Combinational logic 18 can include any variety of logic gates and may receive additional inputs from other flip flops of IC 10. Therefore, combinational logic 18 is a cone of logic whose output is provided to the data input of flip flop 16. The output of flip flop 16, DATA_OUT, can be provided to other combinational logic of IC 10. Also, the data input of flip flop 14 can be provided by another cone of logic.

In order for flip flop 16 to operate correctly, the data value from combinational logic 18 must be valid on DATA_IN a sufficient margin before a triggering edge of CLK. For example, it will be assumed in the examples herein, that flip flops 14 and 16 operate as rising edge flip flops which are triggered by the rising edge of the clock. However, in other embodiment, they may be triggered by the falling edge. Therefore, if the data value is not valid a sufficient margin before the rising edge of the CLK, flip flop 16 will not latch or capture the correct value from combination logic 18. IC 10 therefore also includes a degradation monitoring circuit 20 coupled to DATA_IN to determine when transitioning of a data signal at DATA_IN reaches a critical margin before the rising edge of CLK. At this point, monitoring circuit 20 provides a warning indicator to indicate that the data signal (i.e. data value) at DATA_IN is transitioning too close to the rising edge of CLK. Upon timing path 12 further degrading, the data signal (i.e. data value) at DATA_IN transitions beyond the critical margin, and an actual delay default will occur in which flip flop 16 will not capture the correct data value.

Monitoring circuit 20 samples a data value at DATA_IN and a delayed data value at DATA_IN at a rising edge of CLK and generates a warning indicator when the values are different. For example, referring to FIG. 1, monitoring circuit 20 includes a comparison circuit 40 coupled to DATA_IN, a sampling circuit 42 coupled to an output of comparison circuit 40, and a hold circuit 44 coupled to an output of sampling circuit 42. Comparison circuit 40 includes a delay element 22 and an XOR gate 24. A first input of XOR gate 24 is connected to DATA_IN (the data input of flip flop 16), and a second input of XOR gate 24 is connected to an output of delay element 22. An input of delay element 22 is also connected to DATA_IN. Therefore, the output of delay element 22 provides a data value to the second input of XOR gate 24 that is delayed with respect to the data value of DATA_IN. Therefore, the output of delay element 22 can be referred to as a delay DATA_IN (DDATA_IN). The output of XOR gate 24 is asserted only when the values of DATA_IN and DDATA_IN are different, and negated otherwise.

Sampling circuit 42 has an inverter 28 and AND gates 26 and 30. Hold circuit 44 includes AND gate 32 and OR gate 36. Sampling circuit 42 and hold circuit 44 are each coupled to a same clock signal line as flip flops 14 and 16 and also receives a clock signal. In the illustrated embodiment, the clock signal provided to both sampling circuit 42 and hold circuit 44 is CLK, which is the same clock signal received at the clock inputs of flip flops 14 and 16. However, alternatively, either of these clock signals may be inverted clock signals, or other modified clock signals, taken from the same clock signal line.

Referring to sampling circuit 42, inverter 28 receives the clock signal, CLK, and outputs the inversion of CLK, CLKb. Furthermore, due to the delay introduced by inverter 28, CLKb is delayed with respect to CLK, and may therefore be referred to as delayed CLKb (DCLKb). Note that in alternate embodiment, inverter 28 may not be considered part of sampling circuit 42, in which case, sampling circuit 42 would receive clock signals CLK and DCLKb. A first input of AND gate 26 is coupled to the output of inverter 28 to receive CLKb, and a second input of AND gate 26 is coupled to the output of XOR gate 24 (i.e. the output of comparison circuit 40). A first input of AND gate 30 is coupled to the clock signal line to receive CLK, and a second input of AND gate 30 is coupled to an output of AND gate 26. An output of AND gate 30 provides a sampled output with respect to a rising edge of CLK of comparison circuit 40.

Referring to hold circuit 44, an output of OR gate 36 provides a warning indicator as the output of monitoring circuit 20 to indicate when the timing margin of flip flop 16 has reached a critical point. A first input of AND gate 32 is coupled to the output of OR gate 36 and thus receives, as feedback, the warning indicator. A second input of AND gate 32 is coupled to the clock signal line to receive CLK, and an output of AND gate 32 is coupled to a first input of OR gate 36. A second input of OR gate 36 is coupled to the output of AND gate 30 (i.e. the output of sampling circuit 42).

Still referring to FIG. 1, comparison circuit 40 includes a logic comparator which provides a logic comparison between a data value (i.e. data signal) of DATA_IN and a data value (i.e. data signal) at an output of delay element 22 (which produces a delayed data value of DATA_IN). The logic comparator may perform a logical XOR function (e.g. XOR gate 24). Sampling circuit 42 provides a sampled signal of the output of the logic comparator that is sampled with respect to a clock signal of the clock signal line. For example, this sampled signal may be sampled with respect to a rising or falling edge of the clock signal. Also, this sampled signal may be sampled at a portion of a clock cycle of a clock signal of the clock signal line. As will be described below, sampling circuit 42 performs a logical AND function of the input of inverter 28 (e.g. CLK), the output of inverter 28 (e.g. DCLKb), and the output of comparison circuit 40 (e.g. output of XOR gate 24). Hold circuit 44 provides a warning signal indicative of the data value of DATA_IN transitioning within a predetermined time of an edge transition of a clock signal of the clock signal line. Operation of monitoring circuit 20 will be described in further detail with respect to the timing diagram of FIG. 2.

Figure 2:
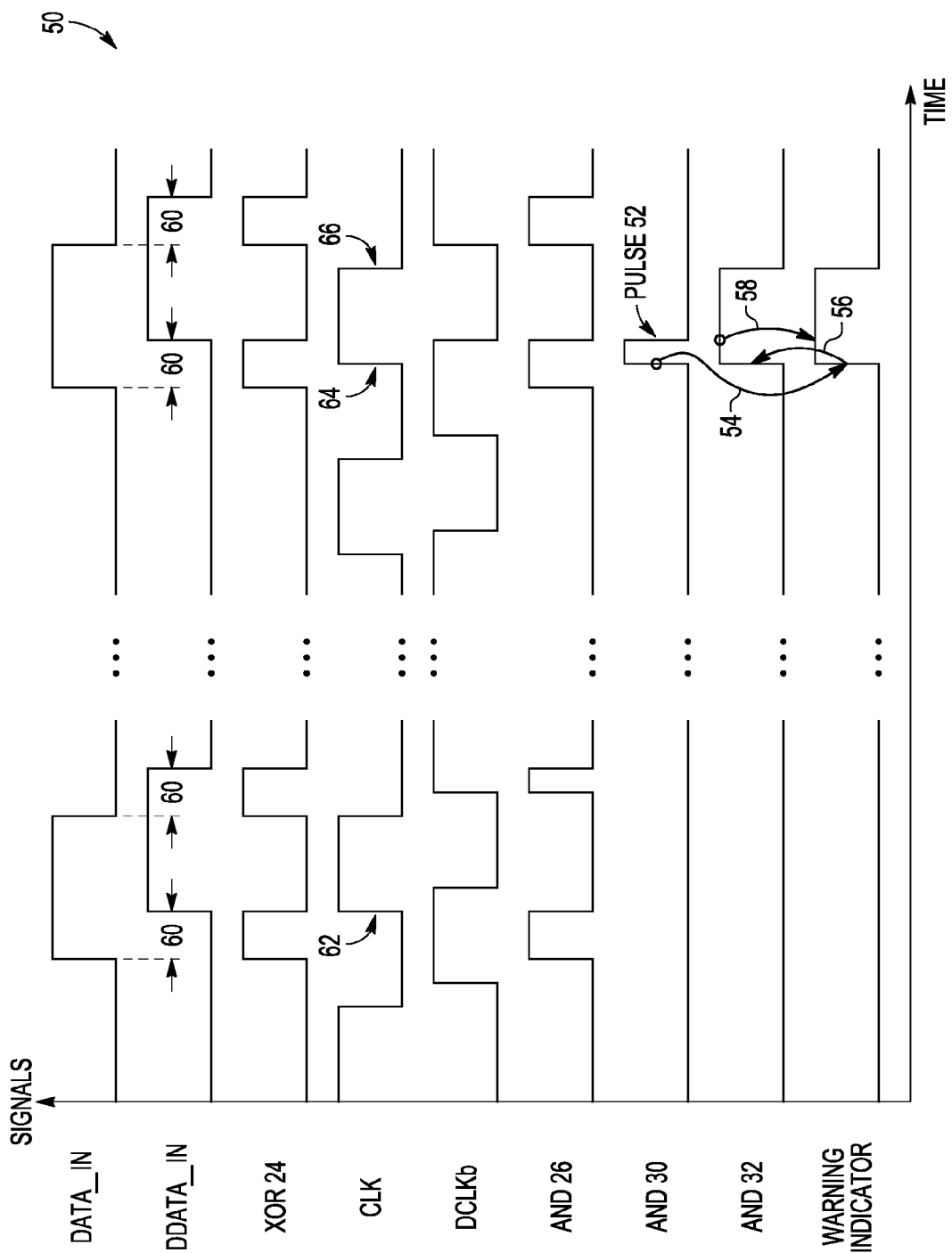
FIG. 2 illustrates, in timing diagram form, various signals of the integrated circuit of FIG. 1, in accordance with one embodiment of the present disclosure.

FIG. 2 illustrates, in timing diagram form, various signals of FIG. 1 in which the values of the signals on the left of the "..." correspond to values at a point in time of the lifetime of IC 10 in which correct operation of timing path 12 is not yet adversely affected by circuit degradation, and the value of the signal on the right of the "..." correspond to value during at a point in time of the lifetime of IC 10 in which circuit degradation has caused timing path 12 to reach a critical margin. That is, at this point in the lifetime of IC 10, a data value at DATA_IN transitions too closely to the rising edge of CLK (i.e., with a predetermined time of a rising edge of CLK) and thus a delay fault may be imminent.

First, the signals to the left of the "..." will be described first, in which circuit degradation has not yet become an issue for timing path 12. In FIG. 2, the data value at DATA_IN is assumed to transition from a zero (a low logic state) to a one (a high logic state). However, note that operation of the circuit is analogous for the data value at DATA_IN transitioning from a one to a zero. The data value of DDATA_IN (which as at the output of delay element 22) has the same value as DATA_IN, but is delayed by a time 60. This time 60 is determined be the length of delay provided by delay element 22, in which delay element 22 can be implemented in a variety of different ways, such as through the use of one or more buffers. When the data values at DATA_IN and DDATA_IN do not match, the output of XOR gate 24 (denoted as XOR24 on FIG. 2) is at a logic level high, and when they do match, at a logic level low. That is, the output of comparison circuit 40 provides indications when the data signal (at DATA_IN) and the delay data signal (at DDATA_IN) are at different logic state. Therefore, note that XOR24 is at a logic level high during time 60.

Sampling circuit 42 ensures that the comparison of the data values of DATA_IN and DDATA_IN are sampled with respect to a clock signal from the clock signal line. In the current example, sampling circuit 42 ensures that the comparison of the data values of DATA_IN and DDATA_IN are sampled with respect to the rising edge 62 of CLK. As illustrated in FIG. 2, DCLKb refers to the output of inverter 28 and therefore, the clock signal of DCLKb is inverted and delayed with respect to CLK. The output of AND gate 26 (denoted as the warning indicator in FIG. 2) is a logic level high only when both DCLKb and the output of XOR gate 24 (XOR24) are logic level highs. Therefore, as seen in FIG. 2, AND26 is a logic level high at two locations, at which XOR24 is a logic level high and DCLKb is a logic level high. The output of AND gate 30 (denoted as AND30 in FIG. 2) is a logic level high only when both CLK and the output of AND gate 26 (AND26) are high. Therefore, since AND26 is not at a logic level high at anytime during which CLK is a logic level one, AND30 remains a logic level zero.

Referring to hold circuit 44, the output of AND gate 32 (denoted AND32 in FIG. 2) receives CLK at one of its inputs. Therefore, whenever CLK is a logic level low, the output of AND gate 32 is low. With the output of AND gate 30 remaining low prior to circuit degradation taking effect, each time CLK is low, the output of OR gate 36 (i.e., the warning indicator) is reset to a logic level low. However, since the output of OR gate 36 is also fed back to an input of AND gate 32, so long as the output AND gate 30 remains low (as it does prior to degradation taking effect), the warning indicator will continuously remain at a logic level low. Therefore, in this example, since a valid data value (corresponding to a logic level high in this example) appears on DATA_IN a sufficient margin of time before rising edge 62 of CLK, no warning is indicated.

After operation of IC 10 over a period of time, circuit degradation adversely affects delay margins, and a valid data value (a logic level high in this example) appears on DATA_IN at a critical margin. That is, the valid data value appears within a predetermined time of a rising edge 64 of CLK which indicates that a critical margin has been reached and a delay default will soon occur after further circuit degradation. This situation is illustrated with the second to the right of the "..." in FIG. 2, at which point circuit degradation has caused a critical margin for timing path 12 to be reached. Again, the data value at DATA_IN is assumed to transition from a zero (a low logic state) to a one (a high logic state). However, note that operation of the circuit is analogous for the data value at DATA_IN transition from a one to a zero. As described above, the data value of DDATA_IN (which is at the output of delay element 22) has the same value as DATA_IN, but is delayed by a time 60. When the data values at DATA_IN and DDATA_IN do not match, the output of XOR gate 24, XOR24, is at a logic level high, and when they do match, at a logic level low. Therefore, note that XOR24 is at a logic level high during time 60.

Sampling circuit 42 ensures that the comparison of the data values of DATA_IN and DDATA_IN is sampled in relationship to a clock signal. In this example, it is sampled in relationship to a rising edge of CLK, such as rising edge 64. As described above, AND26 is a logic level high only when both DCLKb and XOR24 are logic level highs. Therefore, as seen on the right side of FIG. 2, AND26 is a logic level high at two locations, at which XOR24 is a logic level high and DCLKb is a logic level high. AND30 is a logic level high only when both CLK and AND26 are high. In this case, since the transition of the data value at DATA_IN from a logic level low to high came in closer to rising edge 64 of CLK (as compared to rising edge 62 of CLK), there is a small period of time in which both AND26 and CLK are logic level ones, resulting in a pulse 52 at the output of AND 30. This pulse indicates that the data values of DATA_IN and DDATA_IN are different at the rising edge 64 of CLK. In this manner, pulse 52 is aligned with rising edge 64 of the CLK. Pulse 52, which indicates that the data values of DATA_IN and DDATA_IN are different, may therefore occur during an edge transition from a first clock state to a second clock state of a clock signal of the clock signals line. In this example, sampling circuit 42 samples the output of comparison circuit 40 with respect to the rising edge, but in alternate embodiment, sampling circuit 42 may sample the output of comparison circuit 40 with respect to a falling edge of a clock signals of the clock signal line. Alternatively, sampled circuit 42 may sample the output of comparison circuit 40 during any particular predetermined portion of a clock cycle of CLK.

Referring to hold circuit 44, the rising edge of pulse 52 at AND30 results in the value of the warning indicator (the output of OR gate 36) to go to a logic level high, as indicated by arrow 54 in FIG. 2. This logic level high is fed back to AND gate 32 which causes AND32 to go to a logic level high, as indicated by arrow 56 in FIG. 2. Furthermore, AND gate 32 also ensures that the value of the warning indicator at the output of OR gate 36 remains high so long as CLK remains high, as indicated by arrow 58. Upon a subsequent falling edge 66 of CLK, the output of AND gate 32 falls to a logic level low, and the warning indicator is reset to a logic level zero. (Note that upon falling edge 66 of CLK, although AND26 may be a logic level high again, AND30 is no longer a logic level high, thus the second input of OR gate 36 is also a logic level low.) Therefore, the warning indicator, when generated to indicate that a transition of the data value on DATA_IN occurs at a critical margin, is reset upon the subsequent falling edge of CLK. Note that hold circuit 44 thus holds its output (e.g. the warning indicator) at an indication state (e.g. a logic level high) for a particular amount of time, such as for a clock state (e.g. a logic high phase) of a clock signal of the clock line, to indicate the data value or signal at DATA_IN transitioning within a predetermined time of an edge transition (e.g. a rising edge of CLK) of the clock signal. Hold circuit 44 may then reset its output from the indication state to a second state (e.g. a logic low) at a transition to a next clock state (e.g. the next logic low phase) of the clock signal.

Alternate embodiments may use different circuit layouts for each of comparison circuit 40, sampling circuit 42, and hold circuit 44. For example, in one alternate embodiment, AND gates 26 and 30 may be replaced with a three-input AND gate which receives CLK, DCLKb, and the output of comparison circuit 40.

Figure 3:
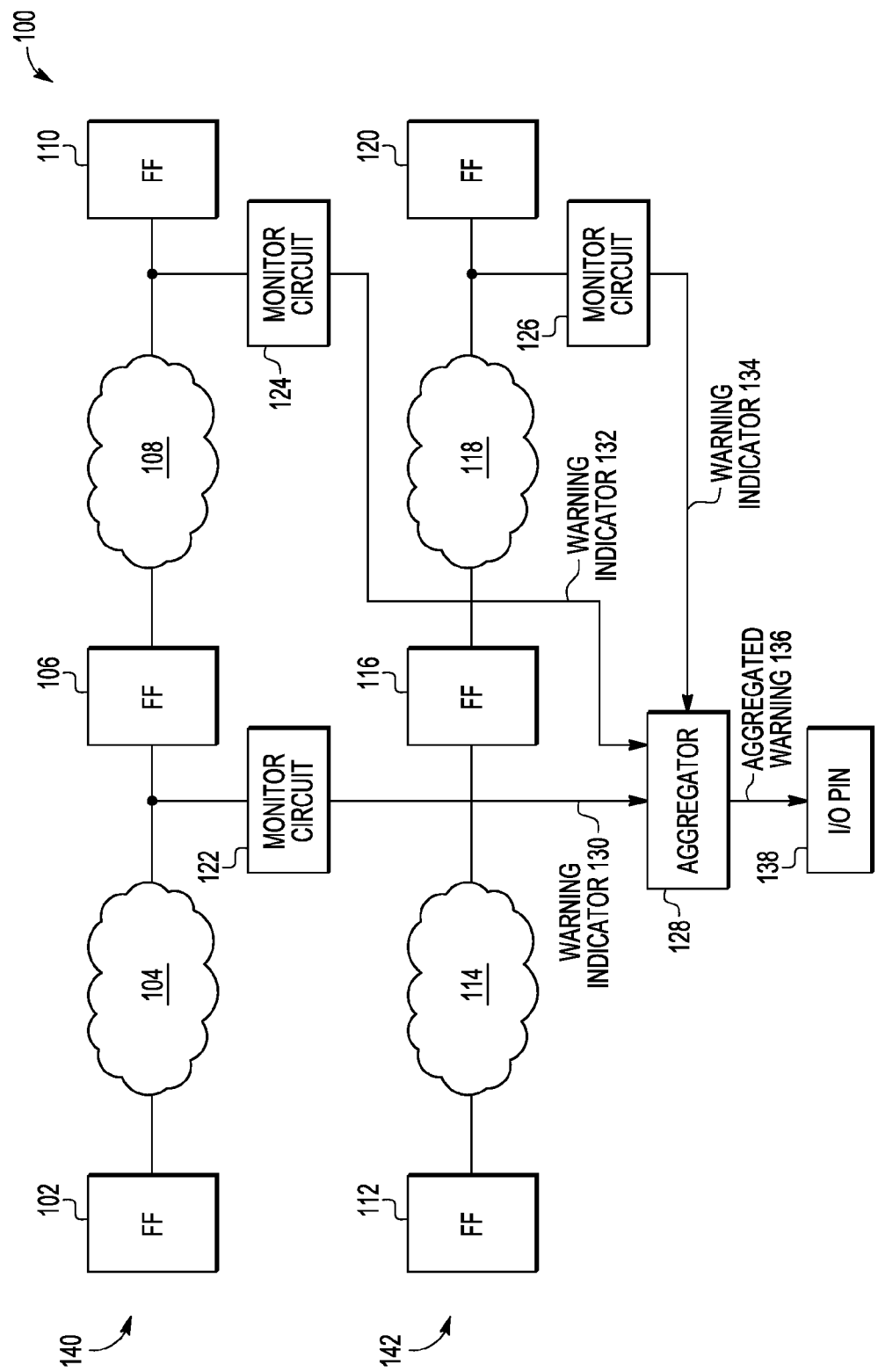
FIG. 3 illustrates, in block diagram form, an integrated circuit having various degradations monitoring circuit in accordance with one embodiment of the present disclosure.

FIG. 3 illustrates an IC 100 which includes a plurality of timing paths, such as timing paths 140 and 142. Note that IC 100 can includes any number of timing paths. Timing path 140 includes flip flops 102, 106, and 110, and combinational logic 104 coupled between flip flops 102 and 106, and combinational logic 108 coupled between flip flops 106 and 110. Timing path 142 includes flip flops 112, 116, and 120, and combinational logic 114 coupled between flip flops 112 and 116, and combinational logic 118 coupled between flip flops 116 and 120. Some timing paths of IC 100 may be more susceptible to circuit degradation than others. In some instances, these may includes critical timing paths. Alternatively, they may include delay paths with more of a particular type of devices, such as p-channel devices. Therefore, in one embodiment, monitoring circuits may be used at the data input node of flip flops in those timing paths or portions of timing paths that are most susceptible to delay faults due to circuit degradation. Therefore, in the illustrated example of FIG. 3, IC 10 includes a degradation monitoring circuit 122 connected to the data node at the input of flip flop 106, a degradation monitoring circuit 124 connected to the data node at the input of flip flop 110, and a degradation monitoring circuit 126 connected to the data node at the input of flip flop 120. However, note that no degradation monitoring circuit is connected to the data node at the input of flip flop 116. In this example, the cone of logic connected to the input of flip flop 116 may not benefit or sufficiently benefit from degradation monitoring. Note that each of degradation monitor circuits 122, 124, and 126 may be the same circuit as described above with respect to monitoring circuit 20.

IC 100 also includes an aggregator circuit 128 which receives the outputs of each of degradation monitor circuits 122, 124, and 126 (warning indicators 130, 132, and 134, respectively). In one embodiment, aggregator circuit 128 receives any warning pulses from any of the degradation monitors of IC 100 and provided an aggregated warning indicator 136. In one embodiment, aggregator circuit 128 may perform a logical ORing of all or a portion of the warning indicators within IC 100. Alternatively, aggregator circuit 128 may perform any function of the warning indicators to provide aggregated warning 136. Aggregated warning indicator 136 can be stored within IC 100 and may also be provided external to IC 100 via an external terminal, such as by way of an input/output (I/O) pin 138. In this manner, warning that a delay default is imminent in IC 100 may be signaled external to IC 100.

Also, note that in the embodiments described herein, a single tap into a timing path between two successive flips flops may be used to implement the degradation monitoring circuits. Also, note that for a degradation monitoring circuit, the comparison circuit compares a data value and delayed data value from an input a flip flop (e.g. comparison circuit 40 for flip flop 16), and need not also rely on an output of that flip flop (e.g. monitoring circuit 20 does not rely on the output of flip flop 16 for its monitoring). These aspects may result in reduced additional loading of the timing path as compared to current techniques.

By now it should be appreciated that a degradation monitoring circuit has been provided which determines differences in a data value and delayed data value at the input of a flip flop of a timing path in order to provide a warning that transitions of the data value have reached a critical timing margin. If the circuit continues to degrade beyond this point, an actual delay fault will soon occur. Furthermore, a sampling circuit is used to ensure that the differences in these values are detected with respect to an edge of a clock signal. Also, the warning indicators, when asserted, may be provided as a pulse that remains asserted while the clock remains at a first logic state (e.g. a logic level high) and reset each time the clock signal returns to a second logic state (e.g. a logic level low). In one embodiment, degradation monitors can be selective placed within selected timing paths of an IC and their outputs can be aggregated to allow for a single warning indicator to be provided external to the IC. This aggregated warning indicator can indicate that circuit degradation has caused at least a portion of the IC to reach a critical timing margin, indicating that an actual delay default will likely occur upon any further circuit degradation.

The terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention is described herein with reference to specific embodiments, various modifications and changes can be made without departing from the scope of the present invention as set forth in the claims below. For example, different logic configuration may be used to implements the comparison, sampling, and hold circuits. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim 1ncludes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The following are various embodiments of the present invention.

Item 1 includes an integrated circuit having a circuit including a timing path, the timing path including an input coupled to a clock signal line, the timing path including a data node; a degradation monitoring circuit including: a comparison circuit, the comparison circuit including a delay element including an input coupled to the data node and including an output to provide a delayed signal of a data signal of the data node, and a logic comparator including a first input coupled to the data node and a second input coupled to the output of the delay element, the logic comparator including an output to provide a logic comparison between a data signal of the data node and the output of the delay element; a sampling circuit including a first input coupled to the output of the logic comparator and a second input coupled to the clock signal line, the sampling circuit including an output to provide a sampled signal of the output of the logic comparator that is a sampled with respect to a clock signal of the clock signal line; and a hold circuit including a first input coupled to the output of the sampling circuit and a second input coupled to the clock signal line, wherein the hold circuit includes an output to provide a signal indicative of a data signal of the data node transitioning within a predetermined time of an edge transition of a clock signal of the clock signal line. Item 2 includes the integrated circuit of item 1, wherein the logic comparator performs a logical XOR function. Item 3 includes the integrated circuit of item 1, wherein the timing path includes a flip flop including a data input and a clock input, the data node is connected to the data input and the clock signal line is coupled to a clock input. Item 4 includes the integrated circuit of item 1, wherein the sampling circuit includes an inverter including an input coupled to the clock signal line and an output to provide a delayed inverted signal of the input of the inverter, wherein the sample circuit is configured to perform a logical AND function of the input of the inverter, the output of the inverter, and the output of the logic comparator. Item 5 includes the integrated circuit of item 1, wherein the hold circuit holds its output at an indication state for a clock state of a clock signal of the clock signal line to indicate a data signal of the data node transitioning within a predetermined time of an edge transition of the clock signal and the hold circuit resets its output from the indication state to a second state at a transition to a next clock state of the clock signal from the clock state. Item 6 includes the integrated circuit of item 1, wherein the logic comparator provides at its output indications of when a data signal of the data node and the output of the delay element are at a different logic state. Item 7 includes the integrated circuit of item 6, wherein the sampling circuit provides as a sampled signal, indications of the indications provided by the output of the logic comparator that occur during an edge transitions from a first clock state to a second clock state of a clock signal of the clock signal line. Item 8 includes the integrated circuit of item 1, and further includes a plurality of degradation monitoring circuits, wherein each degradation monitoring circuit includes an output to provide a signal indicative of a data signal of a data node of a plurality of data nodes of the integrated circuit transitioning within a predetermined time of an edge transition of a clock signal of the clock signal line; an aggregator circuit, including a plurality of inputs for receiving the signals from the plurality of degradation monitoring circuit and the degradation monitoring circuit. Item 9 includes the integrated circuit of item 8, and further includes an external terminal coupled to an output of the aggregator circuit to provide an external indication that a degradation monitoring circuit has detected a data signal transitioning within a predetermined time of an edge transition of a clock signal.

Item 19 includes a method including providing a data signal on a data node of a timing path of a circuit; delaying the data signal by a delay element to provide a delayed data signal; comparing by a logical comparator the data signal to the delayed data signal to provide indications when the data signal and the delayed data signal are at different logic states; sampling the indications from the logical comparator to provide a sampled signal to indicate indications that occur during a particular portion of a clock cycle of a clock signal provided to the timing path, wherein in response to the sampled signal indicating an indication occurring at a particular portion of the clock cycle, a holding circuit provides an output signal at an indication state, for a particular amount of time, indicating the data signal transitioning within a predetermined time of an edge transition of the clock signal. Item 11 includes the method of item 10, wherein the particular amount of time is the time until the end of a single clock state of the clock signal. Item 12 includes the method of item 11, wherein the holding signal resets the output signal to another state when the clock signal changes clock states from the single clock state. Item 13 includes the method of item 10, wherein the comparing includes performing a logical XOR function by the logical comparator. Item 14 includes the method of item 10, wherein a particular portion of the clock cycle includes a transitioning edge of a clock cycle from a first clock state to a second clock state. Item 15 includes the method of item 10, and further includes capturing data of the data signal into a flip flop during an edge transition of the clock signal, wherein the state of the output signal indicates the data signal transitioning within a predetermined time of the edge transition of the clock signal. Item 16 includes the method of item 10, wherein the sampling further includes inverting and delaying the clock signal to provide a delayed inverted clock signal; and logically ANDing the clock signal, the delayed inverted clock signal, and the indications provided by the logical comparator. Item 17 includes the method of item 10, and further including providing an indication external to the integrated circuit that the hold signal is at the indication state. Item 18 includes the method of item 17, wherein the integrated circuit includes a plurality of holding circuits including the holding circuit, wherein each holding circuit of the plurality provides an output signal at an indication state, for a particular amount of time, indicating a data signal at a data node of a plurality of data nodes transitions within a predetermined time of an edge transition of the clock signal; providing an aggregate indication signal at a first state if any of the holding circuits of the plurality provides an output signal at an indication state.

Item 19 includes an integrated circuit including a circuit including a timing path, the timing path including a flip flop, the flip flop including a data input, the flip flop including a clock input coupled to a clock signal line; a degradation monitoring circuit including: a comparison circuit, the comparison circuit including a delay element including an input coupled to the data input and including an output to provide a delayed signal of a data signal of the data input, and a logic comparator including a first input coupled to the data input and a second input coupled to the output of the delay element, the logic comparator including an output to provide a logic comparison between a data signal of the data input and the output of the delay element; a sampling circuit including a first input coupled to the output of the logic comparator and a second input coupled to the clock signal line, the sampling circuit including an output to provide a sampled signal of the output of the logic comparator that is sampled at a portion of a clock cycle of a clock signal of the clock signal line; and a hold circuit including a first input coupled to the output of the sample circuit and a second input coupled to the clock signal line, wherein the hold circuit includes an output to provide a signal indicative of a data signal of the data input transitioning within a predetermined time of an edge transition of a clock signal of the clock signal line. Item 20 includes the integrated circuit of item 19, wherein the hold circuit holds its output at an indication state for a clock state of a clock signal of the clock signal line to indicate a data signal of the data input transitioning within a predetermined time of an edge transition of the clock signal and the hold circuit resets its output from the indication state to a second state at a transition to a next clock state of the clock signal from the clock state.

What is claimed is:

1. An integrated circuit comprising:
    a circuit including a timing path, the timing path including an input coupled to a clock signal line, the timing path including a data node;
    a degradation monitoring circuit comprising:
        a comparison circuit, the comparison circuit comprising:
            a delay element including an input coupled to the data node and including an output to provide a delayed signal of a data signal of the data node;
            a logic comparator including a first input coupled to the data node and a second input coupled to the output of the delay element, the logic comparator including an output to provide a logic comparison between a data signal of the data node and the output of the delay element;
        a sampling circuit including a first input coupled to the output of the logic comparator and a second input coupled to the clock signal line, the sampling circuit including an output to provide a sampled signal of the output of the logic comparator that is a sampled with respect to a clock signal of the clock signal line;
        a hold circuit including a first input coupled to the output of the sampling circuit and a second input coupled to the clock signal line, wherein the hold circuit includes an output to provide a signal indicative of a data signal of the data node transitioning within a predetermined time of an edge transition of a clock signal of the clock signal line.

2. The integrated circuit of claim 1 wherein the logic comparator performs a logical XOR function.

3. The integrated circuit of claim 1 wherein the timing path includes a flip flop including a data input and a clock input, the data node is connected to the data input and the clock signal line is coupled to a clock input.

4. The integrated circuit of claim 1 wherein the sampling circuit includes an inverter including an input coupled to the clock signal line and an output to provide a delayed inverted signal of the input of the inverter, wherein the sample circuit is configured to perform a logical AND function of the input of the inverter, the output of the inverter, and the output of the logic comparator.

5. The integrated circuit of claim 1 wherein the hold circuit holds its output at an indication state for a clock state of a clock signal of the clock signal line to indicate a data signal of the data node transitioning within a predetermined time of an edge transition of the clock signal and the hold circuit resets its output from the indication state to a second state at a transition to a next clock state of the clock signal from the clock state.

6. The integrated circuit of claim 1 wherein the logic comparator provides at its output indications of when a data signal of the data node and the output of the delay element are at a different logic state.

7. The integrated circuit of claim 6 wherein the sampling circuit provides as a sampled signal, indications of the indications provided by the output of the logic comparator that occur during an edge transitions from a first clock state to a second clock state of a clock signal of the clock signal line.

8. The integrated circuit of claim 1 further comprising:
    a plurality of degradation monitoring circuits, wherein each degradation monitoring circuit includes an output to provide a signal indicative of a data signal of a data node of a plurality of data nodes of the integrated circuit transitioning within a predetermined time of an edge transition of a clock signal of the clock signal line;
    an aggregator circuit, including a plurality of inputs for receiving the signals from the plurality of degradation monitoring circuit and the degradation monitoring circuit.

9. The integrated circuit of claim 8 further comprising:
    an external terminal coupled to an output of the aggregator circuit to provide an external indication that a degradation monitoring circuit has detected a data signal transitioning within a predetermined time of an edge transition of a clock signal.

10. A method comprising:
    providing a data signal on a data node of a timing path of a circuit;
    delaying the data signal by a delay element to provide a delayed data signal;

comparing by a logical comparator the data signal to the delayed data signal to provide indications when the data signal and the delayed data signal are at different logic states;

sampling the indications from the logical comparator to provide a sampled signal to indicate indications that occur during a particular portion of a clock cycle of a clock signal provided to the timing path, wherein in response to the sampled signal indicating an indication occurring at a particular portion of the clock cycle, a holding circuit provides an output signal at an indication state, for a particular amount of time, indicating the data signal transitioning within a predetermined time of an edge transition of the clock signal.

11. The method of claim 10, wherein the particular amount of time is the time until the end of a single clock state of the clock signal.

12. The method of claim 11 wherein the holding signal resets the output signal to another state when the clock signal changes clock states from the single clock state.

13. The method of claim 10 wherein the comparing includes performing a logical XOR function by the logical comparator.

14. The method of claim 10 wherein a particular portion of the clock cycle includes a transitioning edge of a clock cycle from a first clock state to a second clock state.

15. The method of claim 10 further comprising:
capturing data of the data signal into a flip flop during an edge transition of the clock signal;
wherein the state of the output signal indicates the data signal transitioning within a predetermined time of the edge transition of the clock signal.

16. The method of claim 10 wherein the sampling further includes:
inverting and delaying the clock signal to provide a delayed inverted clock signal;
logically ANDing the clock signal, the delayed inverted clock signal, and the indications provided by the logical comparator.

17. The method of claim 10 further comprising providing an indication external to the integrated circuit that the hold signal is at the indication state.

18. The method of claim 17 wherein the integrated circuit includes a plurality of holding circuits including the holding circuit, wherein each holding circuit of the plurality provides an output signal at an indication state, for a particular amount of time, indicating a data signal at a data node of a plurality of data nodes transitions within a predetermined time of an edge transition of the clock signal;
providing an aggregate indication signal at a first state if any of the holding circuits of the plurality provides an output signal at an indication state.

19. An integrated circuit comprising:
a circuit including a timing path, the timing path including a flip flop, the flip flop including a data input, the flip flop including a clock input coupled to a clock signal line;
a degradation monitoring circuit comprising:
a comparison circuit, the comparison circuit comprising:
a delay element including an input coupled to the data input and including an output to provide a delayed signal of a data signal of the data input;
a logic comparator including a first input coupled to the data input and a second input coupled to the output of the delay element, the logic comparator including an output to provide a logic comparison between a data signal of the data input and the output of the delay element;
a sampling circuit including a first input coupled to the output of the logic comparator and a second input coupled to the clock signal line, the sampling circuit including an output to provide a sampled signal of the output of the logic comparator that is sampled at a portion of a clock cycle of a clock signal of the clock signal line;
a hold circuit including a first input coupled to the output of the sample circuit and a second input coupled to the clock signal line, wherein the hold circuit includes an output to provide a signal indicative of a data signal of the data input transitioning within a predetermined time of an edge transition of a clock signal of the clock signal line.

20. The integrated circuit of claim 19 wherein the hold circuit holds its output at an indication state for a clock state of a clock signal of the clock signal line to indicate a data signal of the data input transitioning within a predetermined time of an edge transition of the clock signal and the hold circuit resets its output from the indication state to a second state at a transition to a next clock state of the clock signal from the clock state.

* * * * *